United States Patent
Lin et al.

(10) Patent No.: US 9,160,911 B2
(45) Date of Patent: Oct. 13, 2015

(54) IMAGE SENSOR WITH CONVEX SUBSTANCES AND NOTCHES WHICH CHANGE IN ACCORDANCE WITH DISTANCES TO IMAGE SENSOR CENTER

(71) Applicant: Himax Imaging Limited, Tainan (TW)

(72) Inventors: Yu-Tsung Lin, Tainan (TW); Chung-Wei Chang, Tainan (TW); Dong-Long Lin, Tainan (TW)

(73) Assignee: Himax Imaging Limited, Xinshi Dist., Tainan (TW)

( * ) Notice: Subject to any disclaimer, the term of this patent is extended or adjusted under 35 U.S.C. 154(b) by 0 days.

(21) Appl. No.: 14/207,672

(22) Filed: Mar. 13, 2014

(65) Prior Publication Data

US 2015/0070552 A1 Mar. 12, 2015

(30) Foreign Application Priority Data

Sep. 9, 2013 (TW) .............................. 102132453 A

(51) Int. Cl.
*H04N 5/225* (2006.01)
(52) U.S. Cl.
CPC .................................. *H04N 5/2254* (2013.01)
(58) Field of Classification Search
CPC .............. H04N 5/3696; H04N 5/2254; H04N 2209/045; H01L 27/14621; H01L 27/14627
See application file for complete search history.

(56) References Cited

U.S. PATENT DOCUMENTS

| 5,239,172 | A  | * | 8/1993  | Yokota et al. | ............... | 250/208.1 |
| 6,518,640 | B2 | * | 2/2003  | Suzuki et al. | ................. | 257/432   |
| 6,690,049 | B2 | * | 2/2004  | Suzuki et al. | ................. | 257/294   |
| 7,253,399 | B2 | * | 8/2007  | Sakoh et al.  | ................... | 250/239   |
| 7,351,945 | B2 | * | 4/2008  | Campbell et al. | ........... | 250/208.1 |
| 7,411,180 | B2 | * | 8/2008  | Sakoh et al.  | ................... | 250/239   |
| 7,417,214 | B2 | * | 8/2008  | Sakoh et al.  | ................... | 250/208.1 |
| 7,427,742 | B2 | * | 9/2008  | Drowley et al. | ............... | 250/216   |
| 7,456,381 | B2 | * | 11/2008 | Sakoh et al.  | ............... | 250/208.1 |
| 7,459,665 | B2 | * | 12/2008 | Sakoh et al.  | ............... | 250/208.1 |
| 7,531,782 | B2 | * | 5/2009  | Sakoh et al.  | ............... | 250/208.1 |
| 7,656,453 | B2 | * | 2/2010  | Nishi         | ............................ | 348/340 |
| 7,659,929 | B2 | * | 2/2010  | Sakoh         | ........................... | 348/275 |
| 7,683,302 | B2 | * | 3/2010  | Yokozawa      | ................. | 250/208.1 |
| 7,919,743 | B2 | * | 4/2011  | Sakoh et al.  | ................... | 250/239   |
| 7,989,752 | B2 | * | 8/2011  | Yokozawa      | ................. | 250/208.1 |
| 8,134,110 | B2 | * | 3/2012  | Yokozawa      | ................. | 250/208.1 |
| 2001/0039061 | A1 | * | 11/2001 | Suzuki et al. | ..................... | 438/1 |

(Continued)

FOREIGN PATENT DOCUMENTS

TW 201028726 8/2010
TW 201138076 11/2011

(Continued)

*Primary Examiner* — Nicholas Giles

(74) *Attorney, Agent, or Firm* — Winston Hsu; Scott Margo

(57) ABSTRACT

An image sensor is provided in the present invention, including a plurality of optical elements, wherein each optical element includes a semiconductor substrate, a dielectric layer and a color filter set. The semiconductor substrate includes a plurality of photosensitive units. The dielectric layer is disposed above the semiconductor substrate and includes a plurality of notches. The color filter set is disposed above the dielectric layer and includes a plurality of filter units and a plurality of convex substances corresponding to the filter units, and the convex substances and the notches are engaged with each other, wherein the convex substances and the notches change in accordance with the distance to the center of the image sensor.

8 Claims, 4 Drawing Sheets

(56) References Cited

U.S. PATENT DOCUMENTS

| | | | |
|---|---|---|---|
| 2003/0071271 A1* | 4/2003 | Suzuki et al. | 257/98 |
| 2003/0113639 A1* | 6/2003 | Kawase | 430/7 |
| 2004/0165097 A1* | 8/2004 | Drowley et al. | 348/340 |
| 2005/0029433 A1* | 2/2005 | Sakoh et al. | 250/208.1 |
| 2006/0044449 A1* | 3/2006 | Sakoh | 348/336 |
| 2006/0066922 A1* | 3/2006 | Nishi | 358/482 |
| 2006/0125947 A1* | 6/2006 | Packer et al. | 348/340 |
| 2007/0057153 A1* | 3/2007 | Sakoh et al. | 250/208.1 |
| 2007/0187575 A1* | 8/2007 | Sakoh et al. | 250/208.1 |
| 2007/0187576 A1* | 8/2007 | Sakoh et al. | 250/208.1 |
| 2007/0194209 A1* | 8/2007 | Sakoh et al. | 250/208.1 |
| 2007/0246640 A1* | 10/2007 | Sakoh et al. | 250/208.1 |
| 2009/0197366 A1* | 8/2009 | Sakoh et al. | 438/70 |
| 2010/0066876 A1* | 3/2010 | Kurihara | 348/273 |
| 2010/0134663 A1* | 6/2010 | Yokozawa | 348/273 |
| 2011/0233704 A1* | 9/2011 | Yokozawa | 257/432 |
| 2014/0210030 A1* | 7/2014 | Miki | 257/432 |

FOREIGN PATENT DOCUMENTS

| | | |
|---|---|---|
| TW | 201205794 | 2/2012 |
| TW | 201214685 | 4/2012 |
| TW | 201300926 | 1/2013 |

* cited by examiner

IMAGE SENSOR WITH CONVEX SUBSTANCES AND NOTCHES WHICH CHANGE IN ACCORDANCE WITH DISTANCES TO IMAGE SENSOR CENTER

BACKGROUND OF THE INVENTION

1. Field of the Invention

The disclosed embodiments of the present invention relate to an image sensor, and more particularly, to an image sensor for filtering.

2. Description of the Prior Art

With the rapid development of communication systems, many electronic devices are equipped with image capture or video recording functions, especially portable electronic devices such as smart phones or laptops. As users are demanding electronic devices which come in extremely compact sizes, the camera module's image sensor becomes smaller and the chief ray angle (CRA) becomes larger, which causes image quality of corner or edge pixels of the image sensor array to be degraded. Therefore, how to fix lens shading and color shading issues caused by a large CRA has become an extremely important issue in the field.

SUMMARY OF THE INVENTION

One of the objectives of the present invention is to provide an image sensor, especially an image sensor for filtering, to solve the aforementioned issues.

According to a first embodiment of the present invention, an image sensor is disclosed. The image sensor comprises a plurality of optical elements, wherein each optical element comprises a semiconductor substrate, a dielectric layer, and a color filter set. The semiconductor substrate includes a plurality of photosensitive units. The dielectric layer is disposed above the semiconductor substrate and includes a plurality of notches. The color filter set is disposed above the dielectric layer and includes a plurality of filter units and a plurality of convex substances corresponding to the filter units, and the convex substances and the notches are engaged with each other. The convex substances and the notches change in accordance with the distance to the center of the image sensor.

According to a second embodiment of the present invention, an image sensor is disclosed. The image sensor comprises a first optical element, including a semiconductor substrate, a dielectric layer and a color filter set. The semiconductor substrate includes a photosensitive unit. The dielectric layer is disposed above the semiconductor substrate. The color filter set is disposed above the dielectric layer and includes a filter unit, where the center of the filter unit has an offset from the center of the photosensitive unit according to the relative distance between the photosensitive unit and the center of the image sensor.

According to a third embodiment of the present invention, an image sensor is disclosed. The image sensor comprises a second optical element, including a semiconductor substrate, a dielectric layer and a color filter set. The semiconductor substrate includes a photosensitive unit. The dielectric layer is disposed above the semiconductor substrate. The color filter set is disposed above the dielectric layer and includes a filter unit. The filter unit and the photosensitive unit correspond to a same pixel, the center of the filter unit has an offset from the center of the photosensitive unit according to the relative distance between the photosensitive unit and the center of the image sensor, and the center of the filter unit of the first optical element has a first relative displacement from the center of the filter unit of the first optical element, the center of the filter unit of the second optical element has a second relative displacement from the center of the filter unit of the second optical element, wherein the first relative displacement is different from the second relative displacement.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is electrically connected to another device, that connection may be through a direct electrical connection, or through an indirect electrical connection via other devices and connections.

Figure 1:
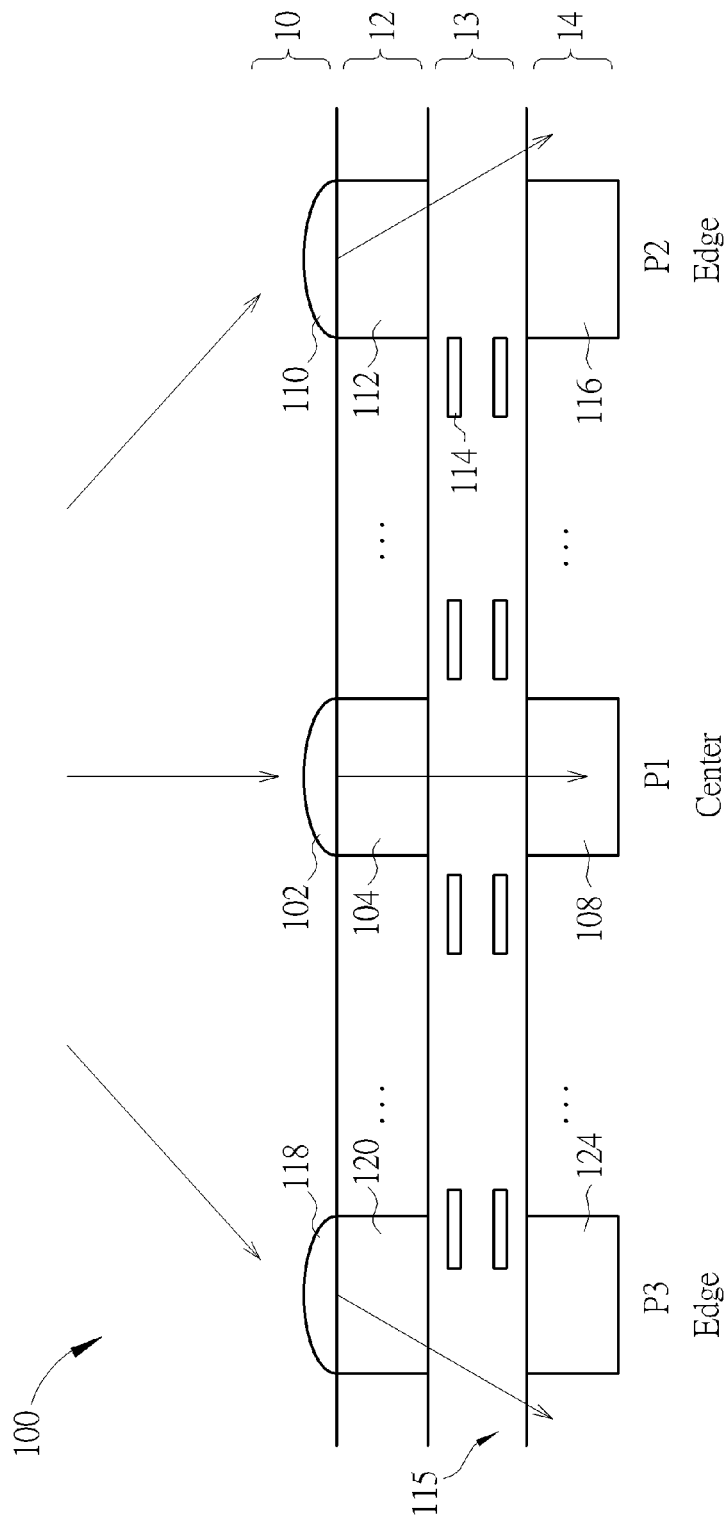
FIG. 1 is a diagram illustrating a conventional image sensor apparatus of a camera module.

Please refer to FIG. 1, which is a diagram illustrating a conventional image sensor apparatus of a camera module. The image sensor apparatus of the camera module includes a micro lens set 10, a color filter set (i.e., a color filter layer) 12, a routing layer 13 and a semiconductor substrate 14, which form a sensor array. The micro lens set 10 includes micro lenses 102, 110 and 118. The color filter set 12 includes filter units 104, 112 and 120. The routing layer 13 includes a metal layer 114 and a dielectric layer 115. The semiconductor substrate 14 includes photosensitive units 108, 116, 124 and other circuit elements not depicted in FIG. 1. As can be seen from the diagram, the chief ray angle (CRA) of the center pixel P1 is 0°, which means that the chief ray enters the micro lens 102 in a direction exactly perpendicular to the camera module, and then passes through the filter unit 104 to arrive at the center of the photosensitive unit 108 with an angle of incidence equal to 0°. The chief ray of the corner pixel P2 has a large inclination angle compared with the chief ray of the center pixel P1, and therefore cannot be fully calibrated although the micro lens 110 is applied for focusing light from every direction. Therefore, compared with the light received by the center pixel P1, the light has to travel a longer path in the filter unit 112 of the corner pixel P2, resulting in an inconsistency between the filtering performance of the corner pixel P2 and the center pixel P1. Moreover, the chief ray leaves the filter unit 112 of the corner pixel P2 non-perpendicularly, causing the chief ray to enter the photosensitive unit 116 with a deviation between the arrival position and the center of the photosensitive unit 116. As a result, issues such as lens shading and color shading may take place. A corner pixel P3, including a micro lens 218, a filter unit 220 and a photosensitive unit 224, may also have the same problems due to these reasons.

Figure 2:
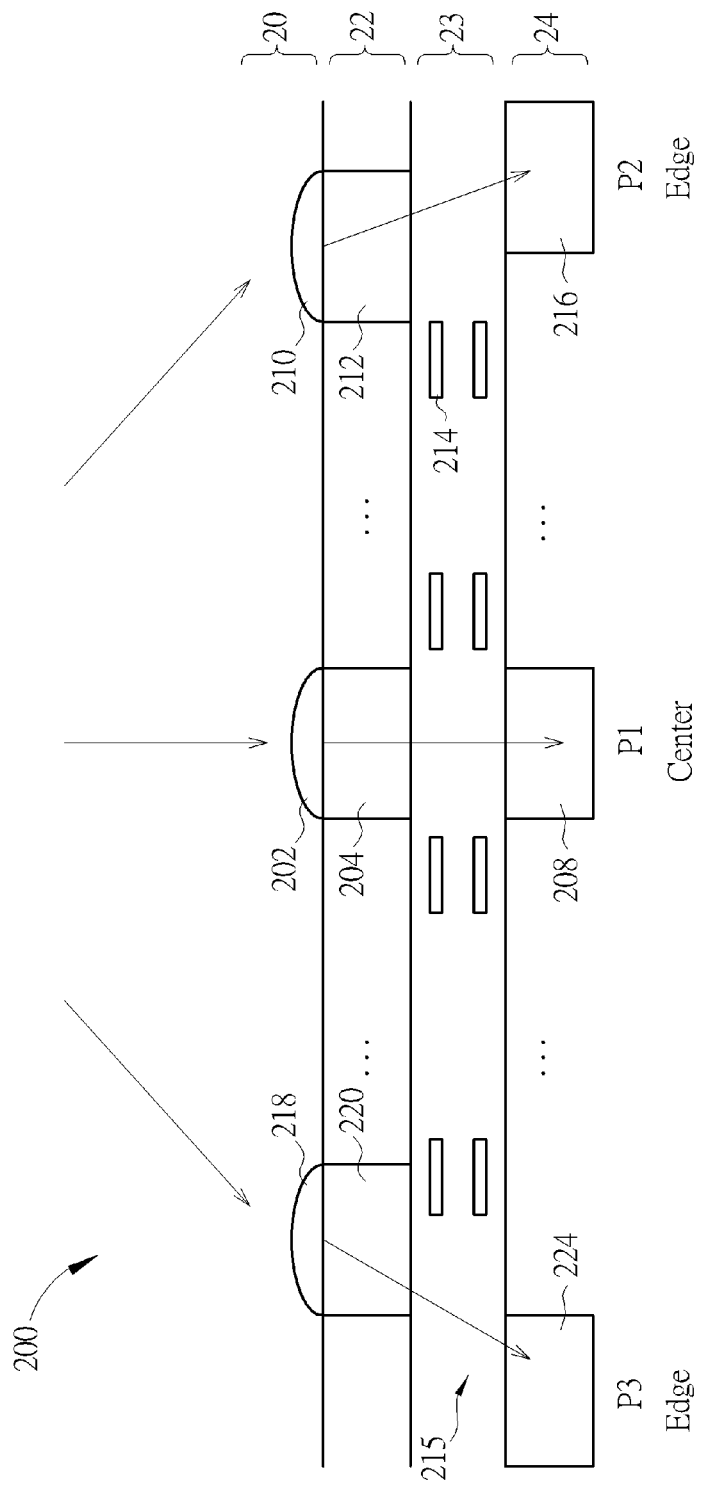
FIG. 2 is a diagram illustrating an image sensor according to a first embodiment of the present invention.

Please refer to FIG. 2, which is a diagram illustrating an image sensor according to a first embodiment of the present invention. In this embodiment, the image sensor 200 includes a micro lens set 20, a color filter set 22, a routing layer 23 and a semiconductor substrate 24 to form a sensor array. The micro lens set 20 includes micro lenses 202, 210 and 218. The color filter set 22 includes filter units 204, 212 and 220. The routing layer 23 includes a metal layer 214 and a dielectric layer 215. The semiconductor substrate 24 includes photosensitive units 208, 216, 224 and other circuit elements not depicted in FIG. 2. Please note that the image senor 200 actually possesses a plurality of optical elements corresponding to a plurality of pixels respectively, but only optical elements of a center pixel P1 and corner pixels P2 and P3 are illustrated here for clarity and simplicity. As can be seen in FIG. 2, the inclination angle of the chief ray of the center pixel P1 is 0°, which means that the chief ray enters the micro lens 202 in a direction exactly perpendicular to the camera module, and then passes through the filter unit 204 to arrive at the center of the photosensitive unit 208 with an angle of incidence equal to 0°. The chief ray of the corner pixel P2 has a large inclination angle compared with the chief ray of the center pixel P1. In order to avoid the situation shown in FIG. 1 where the chief ray enters the photosensitive unit 116 with an offset between the arrival position and the center of the photosensitive unit 116, the center of the filter unit 212 in this embodiment is intentionally designed to deviate from the center of the photosensitive unit 216. In other words, a displacement corresponding to the corner pixel P2 can be calculated based on the CRA and the specifications of the micro lens 210, the filter unit 212 and the photosensitive unit 216. The center of the filter unit 212 therefore has a displacement from the center of the photosensitive unit, allowing the chief ray to arrive at the center of the photosensitive unit 216 after passing through the filter unit 212, which avoids/mitigates the lens shading issue previously prone to occur at the corner pixel P2. It should be noted that any other pixels not depicted in FIG. 2 can also be improved by the method mentioned above to avoid/mitigate the lens shading issue. Therefore, in accordance with the aforementioned method, a displacement corresponding to each pixel is calculated based on CRA of the pixel, and a center of a filter unit of the pixel has a displacement to deviate from a center of a photosensitive unit of the same pixel. In this way, the overall lens shading issue can be avoided/mitigated. Similar descriptions can be used to illustrate the improvement applied to the corner pixel P3, including the micro lens 218, the filter unit 220 and the photosensitive unit 224.

Figure 3:
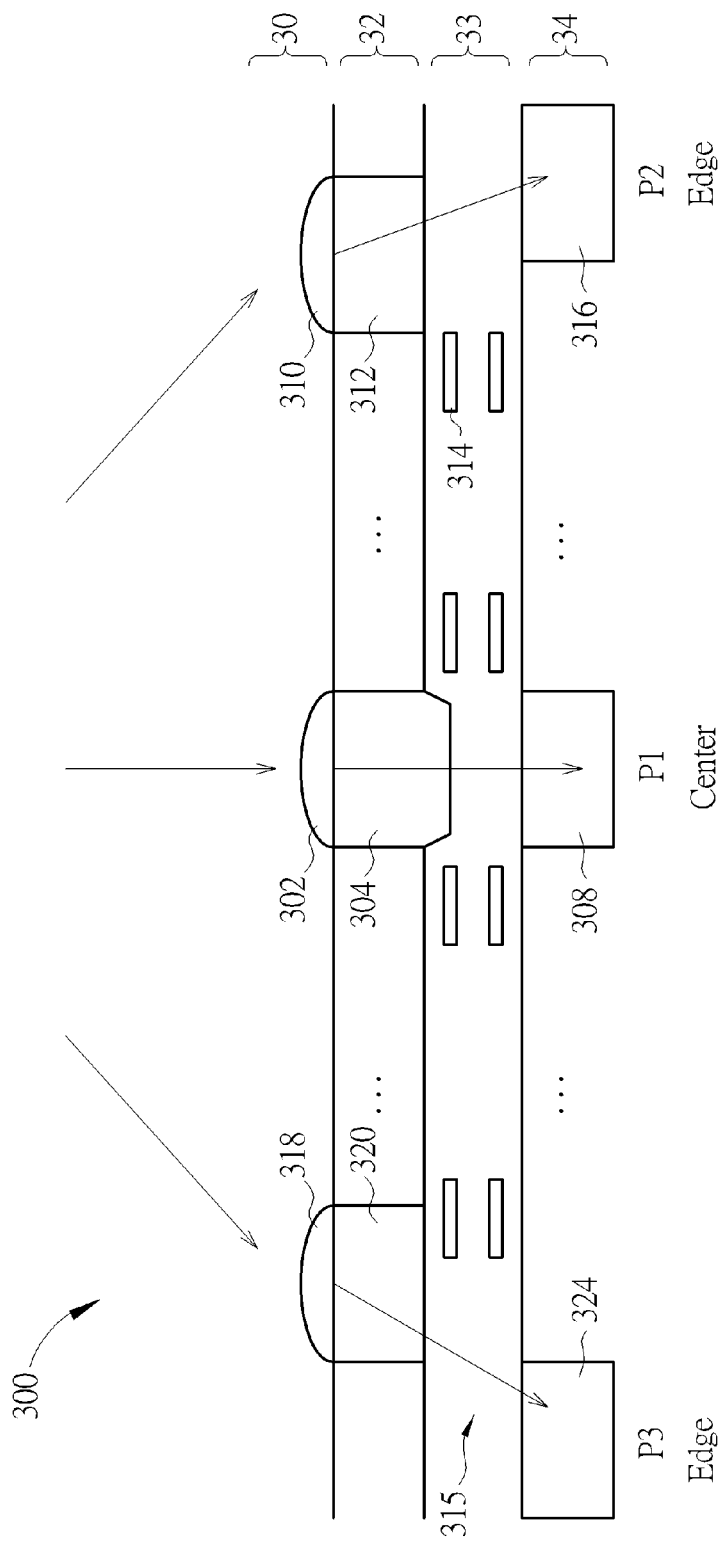
FIG. 3 is a diagram illustrating an image sensor according to a second embodiment of the present invention.

In the aforementioned embodiment, compared with the chief ray travelling along the path in the filter unit 204 of the center pixel P1, the chief ray travels a longer path in the filter unit 212 of the corner pixel P2 and the filter unit 220 of the corner pixel P3, resulting in an inconsistency between the filtering performance of the corner pixels P2 and P3 and the center pixel P1. Therefore, another image sensor is further disclosed according to the present invention. Please refer to FIG. 3, which is a diagram illustrating an image sensor according to a second embodiment of the present invention. In this embodiment, the image sensor 300 may be a portion of a camera module. The image sensor 300 includes a micro lens set 30, a color filter set (i.e., a color filter layer) 32, a routing layer 33 and a semiconductor substrate 34, which form a sensor array. The micro lens set 30 includes micro lenses 302, 310 and 318. The color filter set 32 includes filter units 304, 312 and 320. The routing layer 33 includes a metal layer 314 and a dielectric layer 315. The semiconductor substrate 34 includes photosensitive units 308, 316, 324 and other circuit elements not depicted in FIG. 3. Please note that the image senor 300 actually possesses a plurality of optical elements corresponding to a plurality of pixels respectively; however, only optical elements of a center pixel P1 and corner pixels P2 and P3 are illustrated here for clarity and simplicity. As can be seen in FIG. 3, the CRA of the center pixel P1 is 0°, which means that the chief ray enters the micro lens 302 in a direction exactly perpendicular to the camera module, and then passes through the filter unit 304 to arrive at the center of the photosensitive unit 308 with an angle of incidence equal to 0°. The CRA of the corner pixel P2 is larger than the CRA of the center pixel P1. In order to avoid the situation shown in FIG. 2 where there is an inconsistency between the filtering performance of different pixels due to the chief ray travelling path in the filter unit 212 being longer than the chief ray travelling path in the filter unit 204, the filter unit 304 is shaped by convex modeling, such as a convex substance, and a portion of the dielectric layer 415 corresponding to the filter unit 304 is shaped by concave modeling, such as a notch, where the filter unit 304 and the dielectric layer 415 are combined through the convex substance and the notch engaged with each other. The length of the traveling path of the chief ray in the filter unit 312 of the corner pixel P2 can be calculated based on the CRA and the specifications of the micro lens 310 and the filter unit 312. In addition, the filter unit 304 is thickened due to the convex modeling, so that the length traveling path of the chief ray in the filter unit 304 of the center pixel P1 will be equal to that of the corner pixel P2, thus avoiding/mitigating the color shading issue. It should be noted that any other pixels not depicted in FIG. 2 can also be modified according to the method mentioned above for avoiding/mitigating the color shading issue. Therefore, in accordance with the aforementioned method, a traveling length of the chief ray in a filter unit of each pixel is calculated based on the CRA of the pixel, and traveling lengths of the chief ray in filter units of all pixels are controlled to be equal to each other. In this way, the overall color shading issue can be avoided/mitigated. Similar descriptions can be used to illustrate the corner pixel P3, including the micro lens 318, the filter unit 320 and the photosensitive unit 324.

Please note that the above description focuses on improvement in the center pixel P1 and the corner pixels P2 and P3, but this is not a limitation of the present invention. Performance of any other pixels not depicted in FIG. 3 can also be improved by appropriately designing convex modeling and concave modeling for each pixel according to a practical condition, where each pixel may have convex modeling and concave model with a width and a length different from other pixels. In other words, filter units at different positions may have convex modeling with different widths and lengths. Moreover, it is not necessary to employ the convex modeling and the concave modeling design in this embodiment in conjunction with the displacement design mentioned in the previous embodiment. The convex modeling and the concave modeling design may be employed solely to avoid/mitigate the overall color shading issue.

Figure 4:
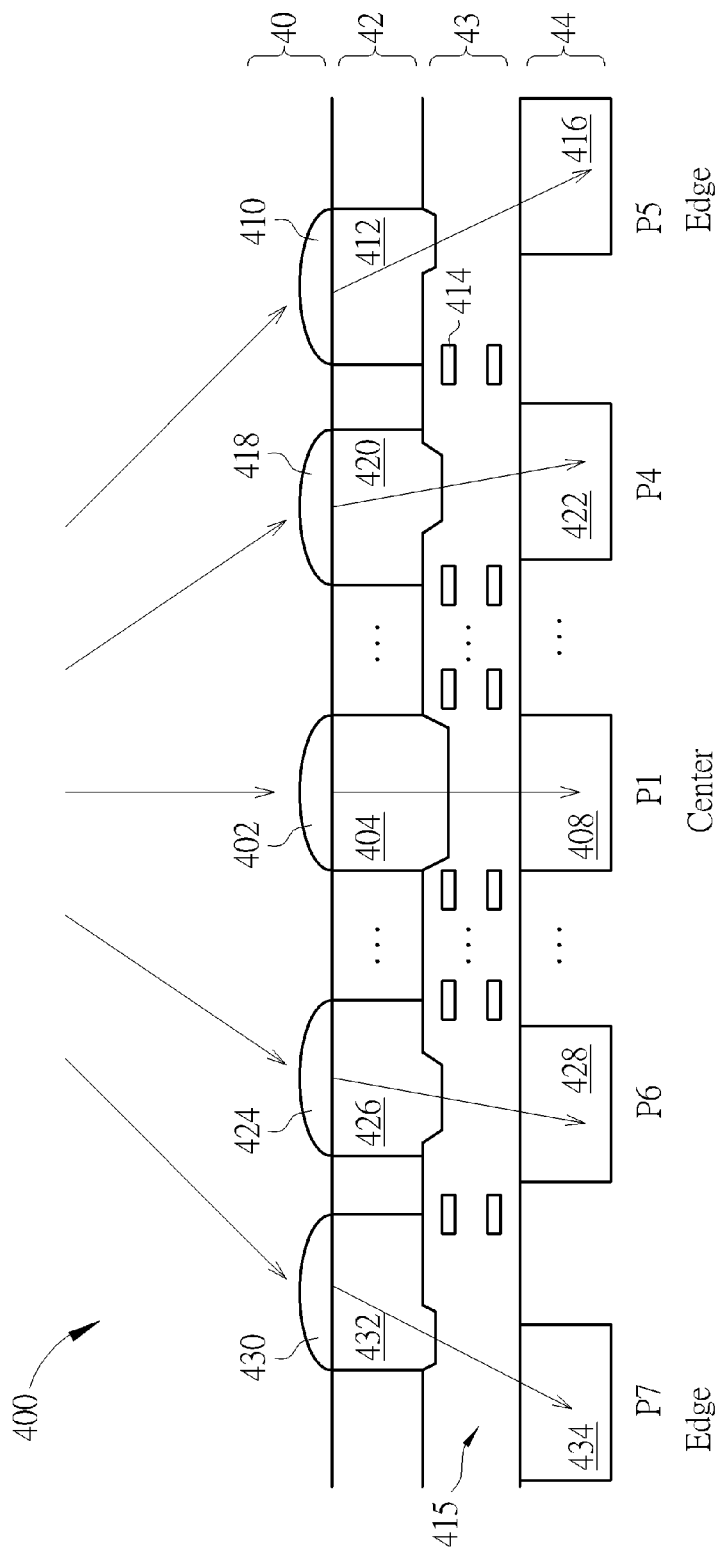
FIG. 4 is a diagram illustrating an image sensor according to a third embodiment of the present invention.

Please refer to FIG. 4, which is a diagram illustrating an image sensor according to a third embodiment of the present invention. In this embodiment, the image sensor 400 may be a portion of a camera module. The image sensor 400 includes a micro lens set 40, a color filter set (i.e., a color filter layer) 42, a routing layer 43 and a semiconductor substrate 44, which form a sensor array. The micro lens set 40 includes micro lenses 402, 410, 418, 424 and 430. The color filter set 42 includes filter units 404, 412, 420, 426 and 432. The routing layer 43 includes a metal layer 414 and a dielectric layer 415. The semiconductor substrate 44 includes photosensitive units 408, 416, 422, 428, 434 and other circuit elements not depicted in FIG. 4. Pixel P1 is a center pixel, intermediate pixels P4 and P6 are disposed around the center pixel (i.e. in between the center pixel and the corner pixels and close to the center pixel), and intermediate pixels P5 and P7 are disposed around the corner pixels (i.e. in between the center pixel and the corner pixels and close to the corner pixels). Please note that the image senor 400 actually possesses a plurality of optical elements corresponding to a plurality of pixels respectively; however, only optical elements of a center pixel P1 and intermediate pixels P4-P7 are illustrated here for clarity and simplicity. As illustrated in FIG. 4, the CRA of the intermediate pixel P4 is slightly greater than 0°, which means that the chief ray enters the micro lens 418 in a direction not exactly perpendicular to the camera module; and the CRA of the intermediate pixel P5 is greater than that of the intermediate pixel P4 (but smaller than that of the corner pixel P2). In order to avoid the situation shown in FIG. 1 and FIG. 2, a method similar to that used for said image sensor 300 is employed to shape the filter unit 420 by convex modeling, such as a convex substance, and shape a portion of the dielectric layer 415 corresponding to the filter unit 420 by concave modeling, such as a notch. The filter unit 420 and the dielectric layer 415 are combined through the convex substance and the notch engaged with other. Furthermore, the filter unit 412 is shaped by convex modeling and a portion of the dielectric layer 415 corresponding to the filter unit 412 is shaped by concave modeling, where the filter unit 412 and the dielectric layer 415 are combined through the convex substance and the notch engaged with other. It should be noted that the length of the traveling path of the chief ray in each of the filter units 418 and 412 of the intermediate pixels P4 and P5 can be calculated based on the CRA and the specifications of the micro lens 418, 410 and the filter unit 420, 412.

In addition, compared with the filter unit 412, the filter unit 420 is thicker due to the convex modeling, so that the traveling path of the chief ray in the filter unit 420 of the intermediate pixel P4 is equal to that in the intermediate pixel P5, equal to that in the center pixel P1 and equal to that in the corner pixel P2 shown in FIG. 3. In this way, the color shading issue is avoided/mitigated. The width and depth of the convex modeling of the filter unit 420 are both smaller than that of the filter unit 304 shown in FIG. 3, while the width and depth of the convex modeling of the filter unit 420 are both larger than that of the filter unit 412 shown in FIG. 4. The relative displacement between the convex modeling of the filter unit 420 and the center of the filter unit 420 is shorter than the relative displacement between the convex modeling of the filter unit 412 and the center of the filter unit 412. It should be noted that any other pixels not depicted in FIG. 4 can also be modified according to the method mentioned above for avoiding/mitigating the color shading issue. Therefore, in accordance with the aforementioned method, a traveling length of the chief ray in a filter unit of each pixel is calculated based on the CRA of the pixel, and traveling lengths of the chief ray in filter units of all pixels are controlled to be equal to each other. In this way, the overall color shading issue can be avoided/mitigated. Similar descriptions can be used to illustrate the intermediate pixel P6 (which includes the micro lens 424, the filter unit 426 and the photosensitive unit 428) and the intermediate pixel P7 (which includes the micro lens 430, the filter unit 432 and the photosensitive unit 434).

The distance of the chief ray traveling path of each pixel will therefore be equal to each other by the novel engagement design of filter units and photosensitive units according to the proposed image sensor of the present invention. Hence, the lens shading and color shading issues liable to take place in the corner and edge pixels can be avoided/mitigated.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. An image sensor, comprising:
a plurality of optical elements, each comprising:
a semiconductor substrate, comprising a plurality of photosensitive units;
a dielectric layer, disposed above the semiconductor substrate and comprising a plurality of notches; and
a color filter layer, disposed above the dielectric layer and comprising a plurality of filter units and a plurality of convex substances corresponding to the filter units, wherein the convex substances and the notches are engaged with each other;
wherein the convex substances and the notches change in accordance with distances to a center of the image sensor.

2. The image sensor of claim 1, wherein the filter units and the photosensitive units correspond to different pixels, respectively.

3. The image sensor of claim 2, wherein the optical elements comprise a first optical element and a second optical element, the convex substance corresponding to the filter unit of the first optical element has a first relative displacement from a center of the filter unit of the first optical element, the convex substance corresponding to the filter unit of the second optical element has a second relative displacement from a center of the filter unit of the second optical element, and the first relative displacement is different from the second relative displacement.

4. The image sensor of claim 2, wherein the optical elements comprise a first optical element and a second optical element, the convex substance corresponding to the filter unit of the first optical element has a first width, the convex substance corresponding to the filter unit of the second optical element has a second width, and the first width is different from the second width.

5. The image sensor of claim 2, wherein the optical elements comprise a first optical element and a second optical element, the convex substance corresponding to the filter unit of the first optical element has a first depth, the convex substance corresponding to the filter unit of the second optical element has a second depth, and the first depth is different from the second depth.

6. The image sensor of claim 2, wherein the optical elements comprise a first optical element and a second optical element, the notch of the dielectric layer of the first optical element has a first relative displacement from a center of the photosensitive unit of the first optical element, the notch of the dielectric layer of the second optical element has a second relative displacement from a center of the photosensitive unit of the second optical element, and the first relative displacement is different from the second relative displacement.

7. The image sensor of claim 2, wherein the optical elements comprise a first optical element and a second optical element, the notch of the dielectric layer of the first optical element has a first width, the notch of the dielectric layer of the second optical element has a second width, and the first width is different from the second width.

8. The image sensor of claim 2, wherein the optical elements comprise a first optical element and a second optical element, the notch of the dielectric layer of the first optical element has a first depth, the notch of the dielectric layer of the second optical element has a second depth, and the first is different from the second depth.

\* \* \* \* \*